United States Patent
Pi et al.

(10) Patent No.: US 11,456,332 B2
(45) Date of Patent: Sep. 27, 2022

(54) MAGNETIC MEMORY DEVICE

(71) Applicant: Samsung Electronics Co., Ltd., Suwon-si (KR)

(72) Inventors: Ung Hwan Pi, Hwaseong-si (KR); Sung Chul Lee, Osan-si (KR); Jangeun Lee, Suwon-si (KR)

(73) Assignee: Samsung Electronics Co., Ltd.

( * ) Notice: Subject to any disclaimer, the term of this patent is extended or adjusted under 35 U.S.C. 154(b) by 247 days.

(21) Appl. No.: 16/884,769

(22) Filed: May 27, 2020

(65) Prior Publication Data

US 2021/0050383 A1 Feb. 18, 2021

(30) Foreign Application Priority Data

Aug. 16, 2019 (KR) .................. 10-2019-0100419

(51) Int. Cl.
*H01L 27/22* (2006.01)
*H01L 43/02* (2006.01)
*G11C 5/02* (2006.01)

(52) U.S. Cl.
CPC .............. *H01L 27/226* (2013.01); *G11C 5/02* (2013.01); *H01L 43/02* (2013.01)

(58) Field of Classification Search
CPC .......... H01L 27/222–228; H01L 43/08; G11C 11/161; G11C 2211/5615; G11C 5/02–05
See application file for complete search history.

(56) References Cited

U.S. PATENT DOCUMENTS

| | | | |
|---|---|---|---|
| 7,924,593 B2 | 4/2011 | Lee et al. |
| 7,952,905 B2 | 5/2011 | Hwang et al. |
| 8,023,305 B2 | 9/2011 | Gaidis et al. |
| 8,130,530 B2 | 3/2012 | Pi et al. |
| 8,331,125 B2 | 12/2012 | Debrosse |
| 8,339,728 B2 | 12/2012 | Kim et al. |
| 8,951,811 B2 | 2/2015 | Gaidis et al. |
| 9,236,106 B2 | 1/2016 | Nakamura |
| 9,653,178 B2 | 5/2017 | Lin et al. |
| 9,691,460 B2 | 6/2017 | Park et al. |

*Primary Examiner* — Amar Movva
(74) *Attorney, Agent, or Firm* — Myers Bigel, P.A.

(57) ABSTRACT

A magnetic memory device includes a first cell array structure including first and second free magnetic patterns which extend in a first direction parallel to a top surface of a substrate and are spaced apart from each other in a second direction intersecting the first direction, and a second cell array structure including a third free magnetic pattern between the first and second free magnetic patterns and a fourth free magnetic pattern spaced apart from the third free magnetic pattern with the second free magnetic pattern therebetween. The first cell array structure further includes a first transistor region including first transistors connected to the first and second free magnetic patterns. The second cell array structure further includes a second transistor region including second transistors connected to the third and fourth free magnetic patterns. The second transistor region is spaced apart from the first transistor region in the first direction.

20 Claims, 13 Drawing Sheets

MAGNETIC MEMORY DEVICE

CROSS-REFERENCE TO RELATED APPLICATION

This U.S. non-provisional patent application claims priority under 35 U.S.C. § 119 to Korean Patent Application No. 10-2019-0100419, filed on Aug. 16, 2019, in the Korean Intellectual Property Office, the disclosure of which is hereby incorporated by reference in its entirety.

FIELD

Embodiments of the inventive concepts relate to magnetic memory devices and, more particularly, to magnetic memory devices using movement of a magnetic domain.

BACKGROUND

There is demand for high-speed and low-voltage memory devices to realize high-speed and low-power electronic devices using such memory devices. A magnetic memory device has been studied as a memory device satisfying these demands. Magnetic memory devices have gained attention as a next-generation memory device because of their high-speed operation characteristics and/or non-volatile characteristics. For example, magnetic memory devices using a movement phenomenon of a magnetic domain wall of a magnetic material have been recently studied and developed.

SUMMARY

Embodiments of the inventive concepts may provide a magnetic memory device configured to improve or increase integration density.

In an aspect, a magnetic memory device may include a first cell array structure comprising first and second free magnetic patterns which extend in a first direction on a surface of a substrate and are spaced apart from each other in a second direction intersecting the first direction, and a second cell array structure comprising a third free magnetic pattern between the first and second free magnetic patterns and a fourth free magnetic pattern spaced apart from the third free magnetic pattern in the second direction with the second free magnetic pattern therebetween. The first cell array structure may further include a first transistor region comprising first transistors connected to the first and second free magnetic patterns. The second cell array structure may further include a second transistor region comprising second transistors connected to the third and fourth free magnetic patterns. The second transistor region may be spaced apart from the first transistor region in the first direction.

In an aspect, a magnetic memory device may include a first cell array structure comprising first group magnetic patterns extending in a first direction on a surface of a substrate and spaced apart from each other in a second direction intersecting the first direction, and a first transistor region comprising first transistors connected to the first group magnetic patterns, and a second cell array structure comprising second group magnetic patterns extending in the first direction between the first group magnetic patterns, and a second transistor region comprising second transistors connected to the second group magnetic patterns. The first transistors may be arranged in the second direction, and the second transistors may be arranged in the second direction. The second transistor region may be spaced apart from the first transistor region in the first direction.

In an aspect, a magnetic memory device may include first group magnetic patterns extending in a first direction on a surface of a substrate and spaced apart from each other in a second direction intersecting the first direction, second group magnetic patterns between the first group magnetic patterns, a first transistor region comprising first transistors connected to first end regions of the first group magnetic patterns and arranged in the second direction, a second transistor region comprising second transistors connected to second end regions of the second group magnetic patterns and arranged in the second direction, a first center transistor region comprising first center transistors connected to respective first center regions of the first group magnetic patterns, and a second center transistor region comprising second center transistors connected to respective second center regions of the second group magnetic patterns. The second transistor region may be spaced apart from the first transistor region in the first direction. Each of the first and second transistor regions and each of the first and second center transistor regions may include a pair of gate electrodes extending in the first direction, and a first dopant region between the pair of gate electrodes.

BRIEF DESCRIPTION OF THE DRAWINGS

The inventive concepts will become more apparent in view of the attached drawings and accompanying detailed description.

DETAILED DESCRIPTION OF THE EMBODIMENTS

Hereinafter, embodiments of the inventive concepts will be described in detail with reference to the accompanying drawings.

Figure 1:
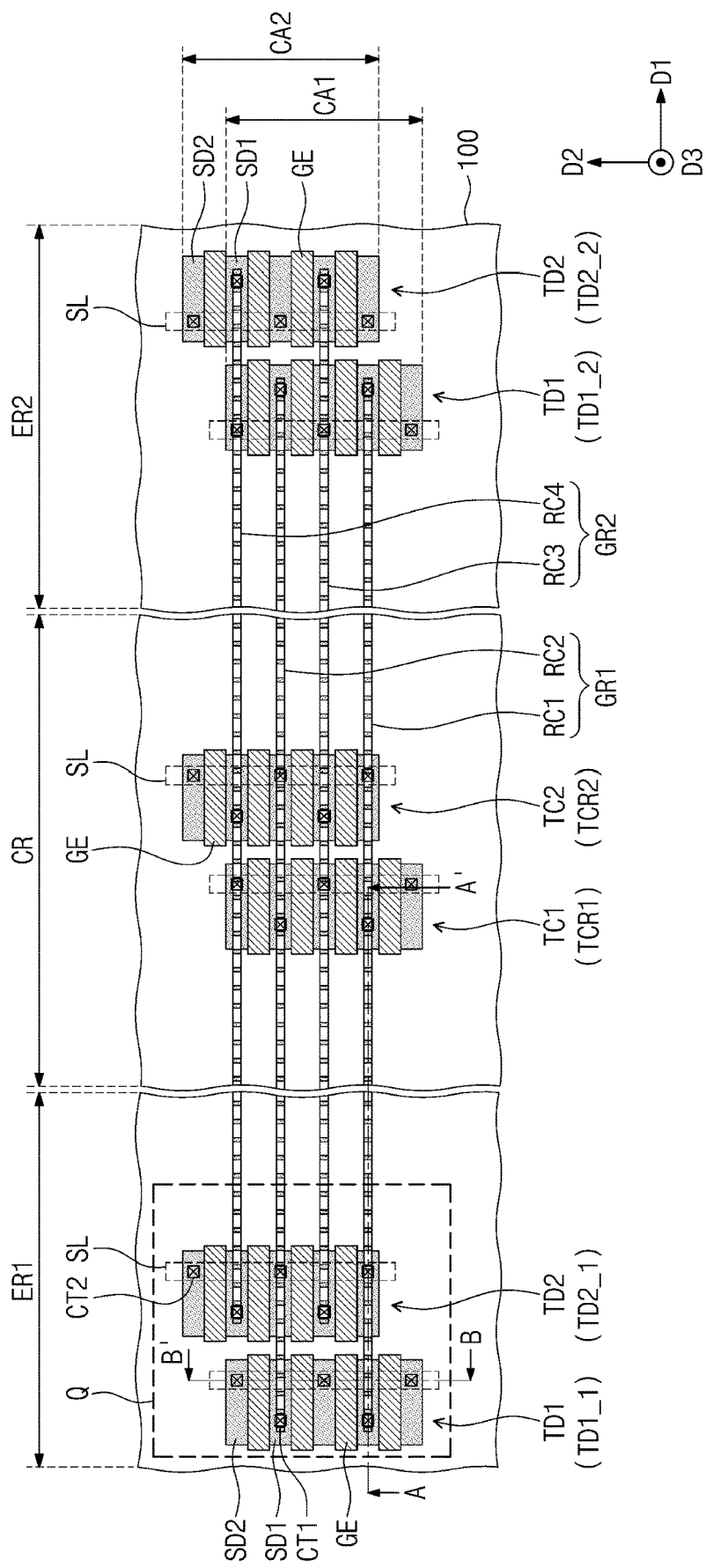
FIG. 1 is a plan view illustrating a magnetic memory device according to some embodiments of the inventive concepts.
Figure 2:
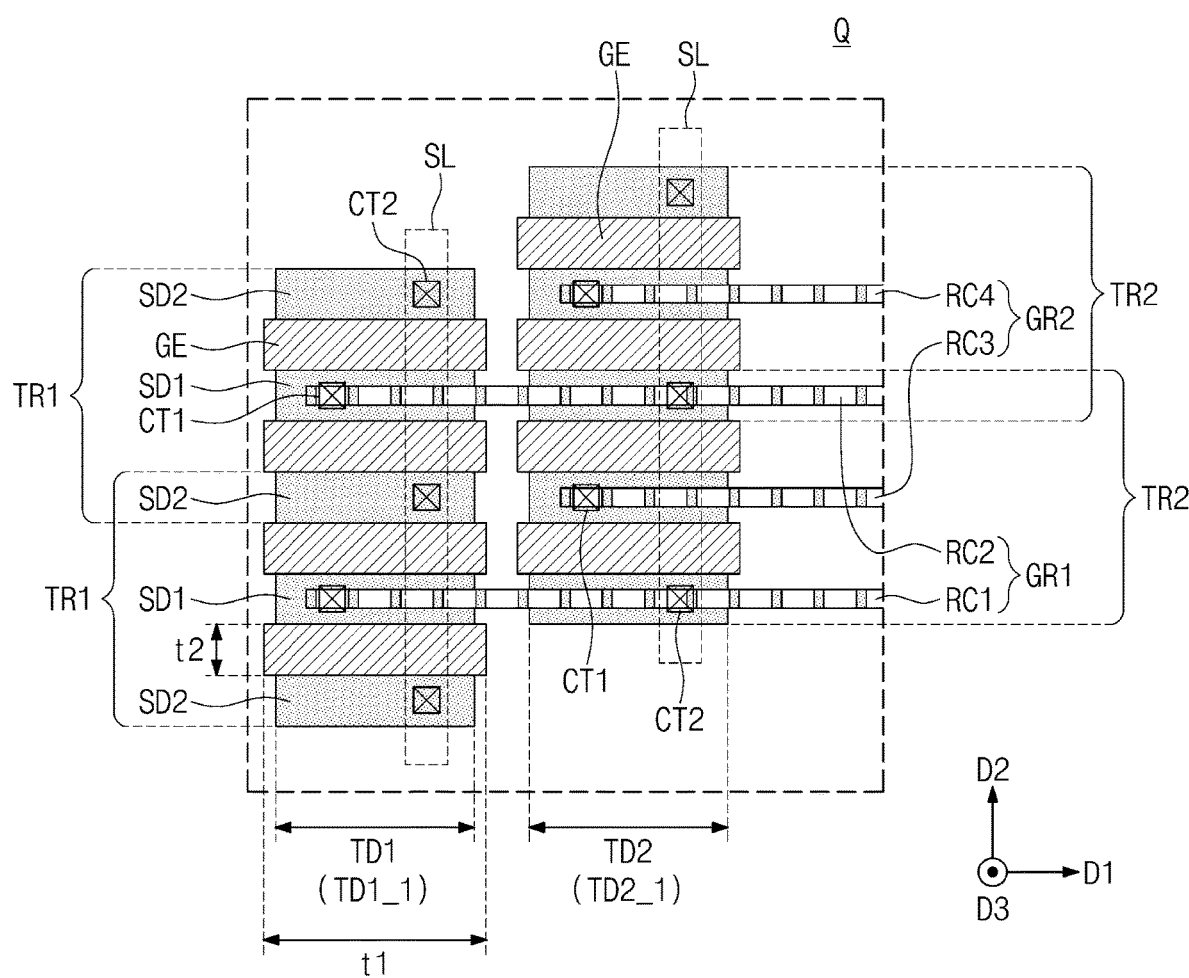
FIG. 2 is an enlarged view of a region 'Q' of FIG. 1.
Figure 3:
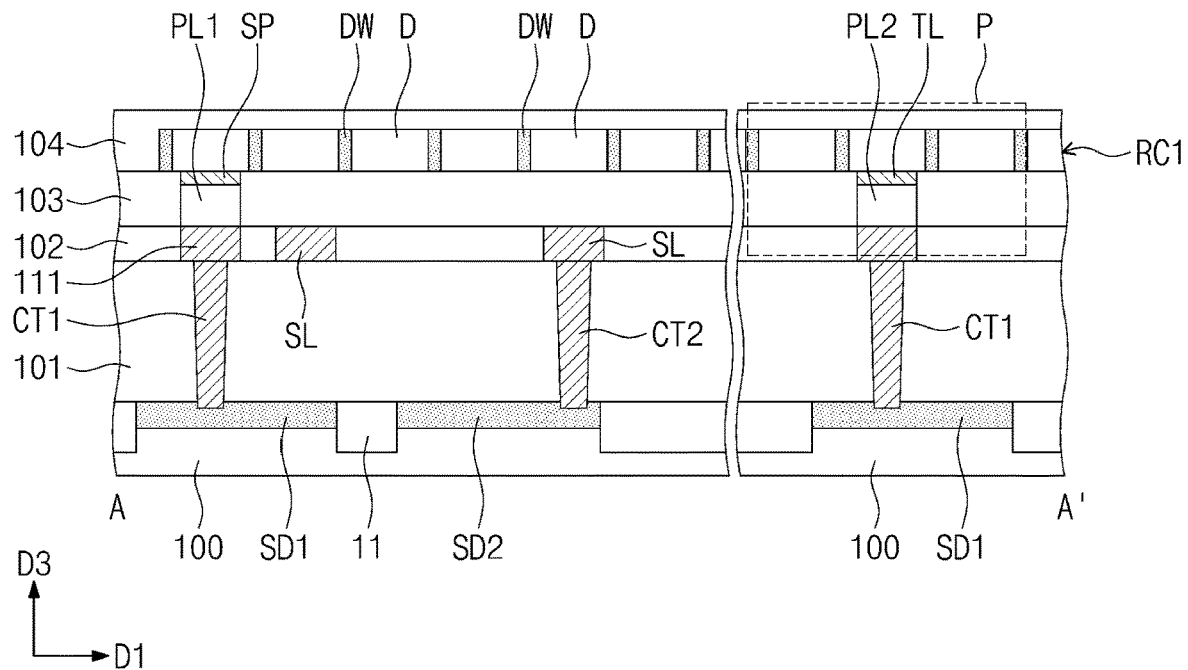
FIGS. 3 and 4 are cross-sectional views taken along lines A-A' and B-B' of FIG. 1, respectively.
Figure 4:
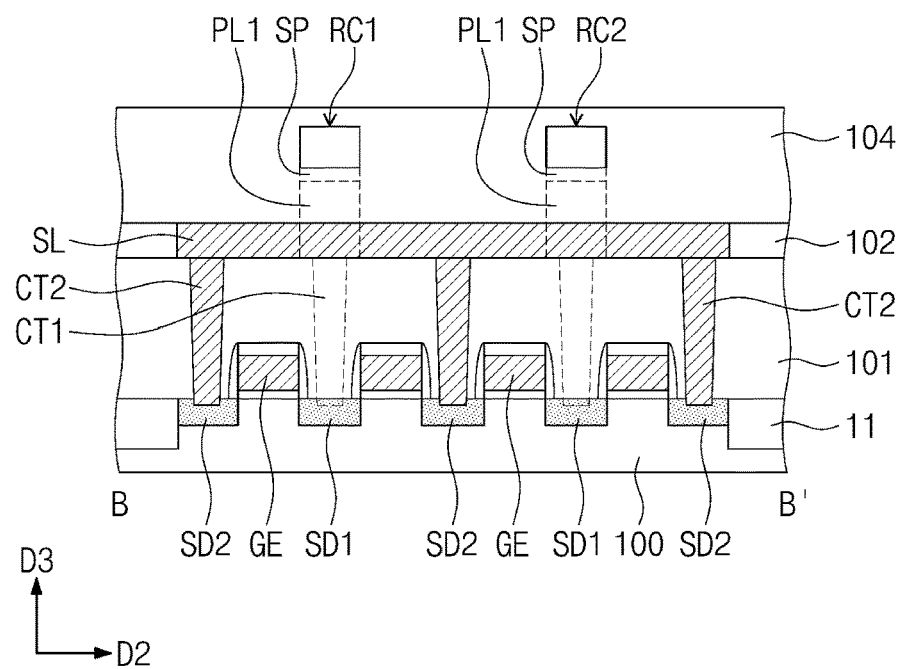
Figure 5:
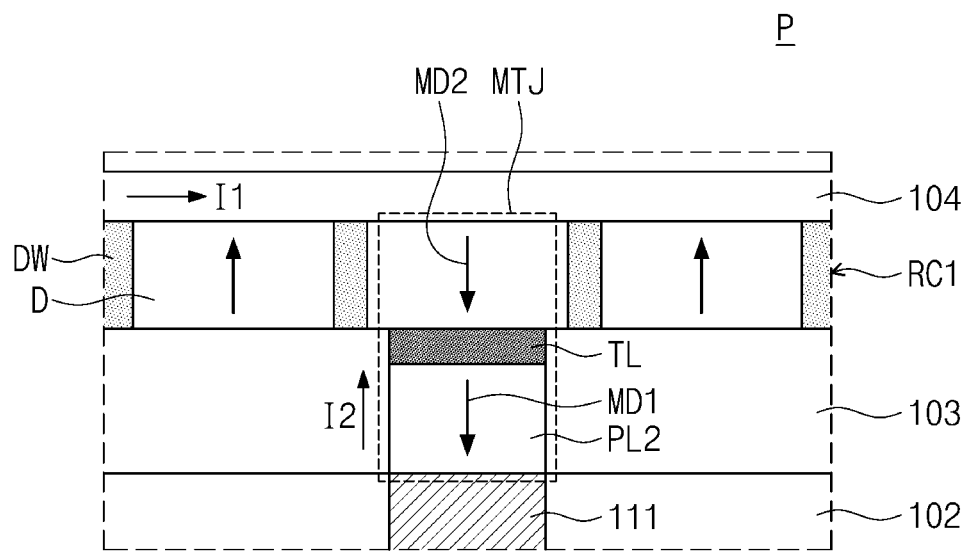
FIGS. 5 and 6 are enlarged views of a region 'P' of FIG. 3.
Figure 6:
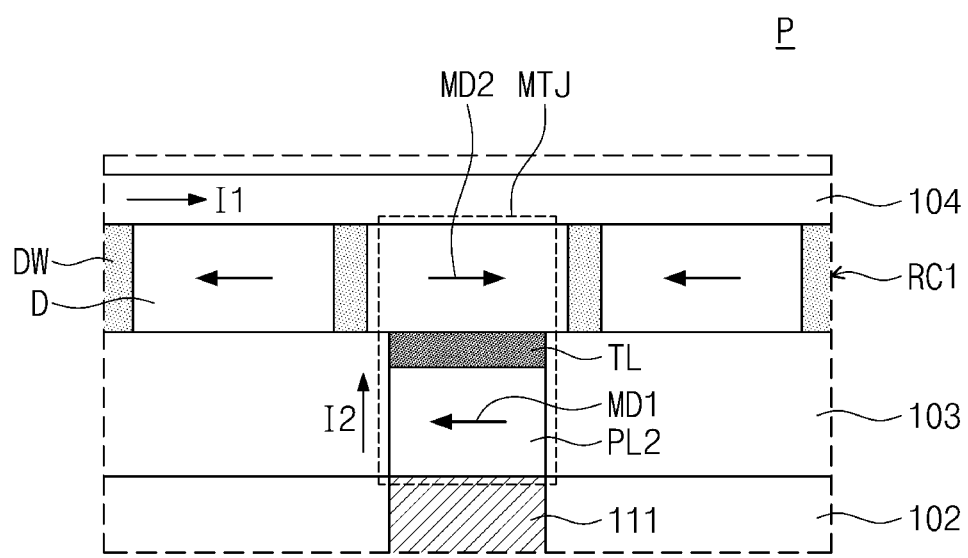

FIG. 1 is a plan view illustrating a magnetic memory device according to some embodiments of the inventive concepts. FIG. 2 is an enlarged view of a region 'Q' of FIG. 1. FIGS. 3 and 4 are cross-sectional views taken along lines A-A' and B-B' of FIG. 1, respectively. FIGS. 5 and 6 are enlarged views of a region 'P' of FIG. 3.

Referring to FIGS. 1 to 4, a first cell array structure CA1 may be provided on a substrate 100. The substrate 100 may be a semiconductor substrate. For example, the semiconductor substrate may include silicon (Si), silicon on an insulator (SOI), silicon-germanium (SiGe), germanium (Ge), or gallium-arsenic (GaAs). The first cell array structure CA1 may include first group magnetic patterns GR1 which extend longitudinally in a first direction D1 parallel to a top surface of the substrate 100. For example, the first group magnetic patterns GR1 may include a first free magnetic pattern RC1 and a second free magnetic pattern RC2. However, embodiments of the inventive concepts are not limited thereto. In certain embodiments, the first group magnetic patterns GR1 may include three or more free magnetic patterns. The terms first, second, third, etc. may be used herein to distinguish one element from another rather than for purposes of limitation, and a first element discussed below could be termed a second element without departing from the scope of the present inventive concepts.

The second free magnetic pattern RC2 may be spaced apart from the first free magnetic pattern RC1 in a second direction D2 which intersects the first direction D1 and is parallel to the top surface of the substrate 100. Lengths of the first group magnetic patterns GR1 may be substantially equal to each other. End portions of the first group magnetic patterns GR1 may be aligned with each other in the second direction D2. For example, both end portions of the second free magnetic pattern RC2 may be spaced apart from both end portions of the first free magnetic pattern RC1, respectively, in the second direction D2.

The first cell array structure CA1 may include a first transistor region TD1 which includes first transistors TR1 connected to the first group magnetic patterns GR1. In the present embodiments, the first transistor region TD1 may be disposed under each of end regions ER1 and ER2 of the first group magnetic patterns GR1. For example, a $(1\_1)^{th}$ transistor region TD1_1 may be disposed under a first end region ER1 of the first group magnetic patterns GR1, and a $(1\_2)^{th}$ transistor region TD1_2 may be disposed under a second end region ER2 spaced apart from the first end region ER1 in the first direction D1. A structure and arrangement of the $(1\_2)^{th}$ transistor region TD1_2 and components (e.g., contacts and a source line) thereon may be symmetrical with or the same as those of the $(1\_1)^{th}$ transistor region TD1_1 and components thereon. Hereinafter, the first transistors TR1 of the $(1\_1)^{th}$ transistor region TD1_1 will be described as an example.

The first transistors TR1 may be arranged in the second direction D2. In the present embodiments, the first transistors TR1 may be driver transistors for moving magnetic domains of the first group magnetic patterns GR1. The first transistors TR1 may be connected to the end portions of the first and second free magnetic patterns RC1 and RC2 in one-to-one correspondence. Each of the first transistors TR1 may include a pair of gate electrodes GE extending longitudinally in the first direction D1, a first dopant region SD1 between the gate electrodes GE, and a pair of second dopant regions SD2 spaced apart from the first dopant region SD1 with the gate electrodes GE interposed therebetween.

The gate electrodes GE may be provided on the substrate 100, and a gate insulating layer (or a tunnel insulating layer) may be provided between the substrate 100 and the gate electrodes GE. For example, the gate electrodes GE may include a conductive material such as a metal and/or doped silicon. The first and second dopant regions SD1 and SD2 may be provided in a region defined by a device isolation layer 11 provided in an upper portion of the substrate 100. For example, the first and second dopant regions SD1 and SD2 may be doped with N-type dopants. Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures.

In some embodiments, the first transistors TR1 adjacent to each other may share the second dopant region SD2 therebetween, as illustrated in FIG. 2. For example, the first dopant region SD1 may be a drain region, and the second dopant region SD2 may be a source region. Each of the gate electrodes GE may have a bar shape having a long axis in the first direction D1. For example, a width t1, in the first direction D1, of each of the gate electrodes GE may range from 5 times to 20 times a width t2, in the second direction D2, of each of the gate electrodes GE. The first and second dopant regions SD1 and SD2 may also have bar shapes extending longitudinally in the first direction D1, like the gate electrodes GE.

First contacts CT1 may be provided on the first dopant regions SD1, and second contacts CT2 may be provided on the second dopant regions SD2. The second contacts CT2 may be spaced apart or offset from the first contacts CT1 in the first direction D1. In the present specification, it may be understood that when the second contacts CT2 are spaced apart or offset from the first contacts CT1 in the first direction D1, an imaginary line connecting the second contacts CT2 is spaced apart from (rather than being aligned with) an imaginary line connecting the first contacts CT1 in the first direction D1.

The first and second contacts CT1 and CT2 may be disposed in a first interlayer insulating layer 101. Bottom electrodes 111 may be disposed on the first contacts CT1, and source lines SL may be disposed on the second contacts CT2. The bottom electrodes 111 and the source lines SL may be disposed in a second interlayer insulating layer 102. The bottom electrodes 111 and the source lines SL are disposed at the same level in the present embodiments. However, embodiments of the inventive concepts are not limited thereto.

The bottom electrodes 111 may be in contact with top surfaces of the first contacts CT1, respectively, and may be in contact with bottom surfaces of lower magnetic patterns to be described later. Each of the source lines SL may extend longitudinally in the second direction D2 and may be connected to a plurality of the second contacts CT2. The first and second contacts CT1 and CT2, the bottom electrodes 111 and the source lines SL may include a metal material such as tungsten, titanium, copper, or aluminum.

First lower magnetic patterns PL1 and conductive spacers SP may be sequentially disposed on the bottom electrodes 111. The first lower magnetic patterns PL1 and the conductive spacers SP may be disposed in a third interlayer insulating layer 103. Each of the first lower magnetic patterns PL1 may be a reference layer having a magnetization direction fixed in one direction. The conductive spacers SP may include a conductive material such as a metal material (e.g., tungsten, titanium, copper, or aluminum) and/or a conductive nitride thereof. The end portions of the first and second free magnetic patterns RC1 and RC2 may be electrically connected to the first dopant regions SD1 of the first transistors TR1 through the conductive spacers SP, the first lower magnetic patterns PL1, the bottom electrodes 111 and the first contacts CT1.

The first and second free magnetic patterns RC1 and RC2 may be provided on the third interlayer insulating layer 103. The first and second free magnetic patterns RC1 and RC2 may be disposed in a fourth interlayer insulating layer 104. For example, each of the first to fourth interlayer insulating layers 101, 102, 103 and 104 may include silicon oxide, silicon nitride, and/or silicon oxynitride.

A first center transistor region TCR1 may be provided under a center region CR between the first end region ER1 and the second end region ER2. The first center transistor region TCR1 may be disposed at equal distances from both end portions of the first group magnetic patterns GR1. However, embodiments of the inventive concepts are not limited thereto. The first cell array structure CA1 includes a single first center transistor region TCR1 in the present embodiments. Alternatively, a plurality of the first center transistor regions TCR1 spaced apart from each other in the first direction D1 may be provided.

The first center transistor region TCR1 may include first center transistors TC1 arranged in the second direction D2. Shapes and arrangement of the first center transistors TC1 and components (i.e., contacts and a source line) disposed thereon may be substantially the same as those of the first transistors TR1 and the components (i.e., the contacts CT1 and CT2 and the source line SL) disposed thereon. Bottom electrodes 111 may be provided on first contacts CT1 of the first center transistors TC1, and second lower magnetic patterns PL2 may be disposed on the bottom electrodes 111. Tunnel barrier patterns TL may be provided on the second lower magnetic patterns PL2.

The first group magnetic patterns GR1 may include a plurality of magnetic domains D and a plurality of magnetic domain walls DW. For example, the magnetic domains D and the magnetic domain walls DW may be alternately and repeatedly arranged in the first direction D1 in the first free magnetic pattern RC1. Each of the magnetic domains D may be a region in a magnetic body, in which a magnetization direction is uniform. Each of the magnetic domain walls DW may be a region between the magnetic domains D in the magnetic body, in which a magnetization direction changes. Each of the magnetic domain walls DW may define a boundary between the magnetic domains D having different magnetization directions. Sizes and magnetization directions of the magnetic domains D may be appropriately controlled by a shape and/or a size of the magnetic body and external energy. The magnetic domains D and the magnetic domain walls DW may be moved by a magnetic field or current applied to the magnetic body. For example, the magnetic domains D and the magnetic domain walls DW may be moved by a first current I1 supplied to the first group magnetic patterns GR1 through the first transistors TR1. The first group magnetic patterns GR1 may include at least one of cobalt (Co), iron (Fe), or nickel (Ni). The tunnel barrier patterns TL may include at least one of a magnesium oxide (MgO) layer, a titanium oxide (TiO) layer, an aluminum oxide (AlO) layer, a magnesium-zinc oxide (MgZnO) layer, or a magnesium-boron oxide (MgBO) layer.

The second lower magnetic patterns PL2, the tunnel barrier patterns TL and the first group magnetic patterns GR1 (more particularly, the magnetic domains D disposed on the second lower magnetic patterns PL2) may constitute or define magnetic tunnel junctions MTJ as illustrated in FIGS. 5 and 6. Each of the magnetic domains D may have a magnetization direction changeable to be parallel or anti-parallel to a magnetization direction of the second lower magnetic pattern PL2. In some embodiments, referring to FIG. 5, a magnetization direction MD1 of the second lower magnetic pattern PL2 and a magnetization direction MD2 of each of the magnetic domains D may be substantially perpendicular to an interface between the tunnel barrier pattern TL and the second lower magnetic pattern PL2. The first lower magnetic patterns PL1 may also have the same magnetization direction as the second lower magnetic patterns PL2.

The first and second lower magnetic patterns PL1 and PL2 and the first group magnetic patterns GR1 may include at least one of a perpendicular magnetic material (e.g., CoFeTb, CoFeGd, or CoFeDy), a perpendicular magnetic material having a $L1_0$ structure, a CoPt alloy having a hexagonal close packed (HCP) lattice structure, or a perpendicular magnetic structure. The perpendicular magnetic material having the $L1_0$ structure may include at least one of FePt having the $L1_0$ structure, FePd having the $L1_0$ structure, CoPd having the $L1_0$ structure, or CoPt having the $L1_0$ structure. The perpendicular magnetic structure may include magnetic layers and non-magnetic layers, which are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" denotes the number of bilayers.

In certain embodiments, referring to FIG. 6, the magnetization direction MD1 of the second lower magnetic pattern PL2 and the magnetization direction MD2 of each of the magnetic domains D may be substantially parallel to the interface between the tunnel barrier pattern TL and the second lower magnetic pattern PL2. The first lower magnetic patterns PL1 may also have the same magnetization direction as the second lower magnetic patterns PL2. In this case, the first and second lower magnetic patterns PL1 and PL2 and the first group magnetic patterns GR1 may include a ferromagnetic material, and the first and second lower magnetic patterns PL1 and PL2 may further include an anti-ferromagnetic material for fixing a magnetization direction of the ferromagnetic material.

Read and write operations of the magnetic memory device according to some embodiments of the inventive concepts will be described with reference to FIGS. 5 and 6.

A first current I1 may be supplied to the first group magnetic pattern GR1 (e.g., the first free magnetic pattern RC1) through the first transistor TR1. A movement direction of the magnetic domain walls DW may be determined by a direction of the first current I1. The magnetic domain walls DW may be moved in a movement direction of electrons, and thus the magnetic domain walls DW may be moved in a direction opposite to the direction of the first current I1. For example, the first current I1 may flow in the first direction D1, and the magnetic domain walls DW may be moved in a direction opposite to the first direction D1.

A second current I2 may be supplied to the magnetic tunnel junction MTJ through the second lower magnetic pattern PL2. For example, the second current I2 may be a read current. A resistance state of the magnetic tunnel junction MTJ may be detected by or determined from the second current I2. For example, the magnetization direction MD2 of the magnetic domain D in the magnetic tunnel junction MTJ may be parallel to the magnetization direction MD1 of the second lower magnetic pattern PL2, and in this case, the magnetic tunnel junction MTJ may be in a low-resistance state. When the magnetization direction MD2 of the magnetic domain D in the magnetic tunnel junction MTJ is anti-parallel (or opposite) to the magnetization direction MD1 of the second lower magnetic pattern PL2, the magnetic tunnel junction MTJ may be in a high-resistance state. Data (0 or 1) stored in the magnetic domain D may be detected from the resistance state of the magnetic tunnel junction MTJ.

Thereafter, the first current I1 may flow through the first free magnetic pattern RC1 to move an adjacent magnetic domain D onto the second lower magnetic pattern PL2, and the moved magnetic domain D and the second lower magnetic pattern PL2 may constitute or define a magnetic tunnel junction MTJ. The second current I2 may be supplied to the magnetic domain D moved on the second lower magnetic pattern PL2, thereby detecting a resistance state of the magnetic tunnel junction MTJ.

In certain embodiments, the second current I2 may be a write current. A magnitude of the write current may be greater than a magnitude of the read current. The magnetization direction MD2 of the magnetic domain D may be reversed by spin-transfer torque generated by the write current. For example, the magnetization direction MD2 of the magnetic domain D may be switched in anti-parallel to the magnetization direction MD1 of the second lower magnetic pattern PL2 by the spin-transfer torque generated by the write current. Thereafter, the first current I1 may flow through the first free magnetic pattern RC1 to move an adjacent magnetic domain D onto the second lower magnetic pattern PL2, and the moved magnetic domain D and the second lower magnetic pattern PL2 may constitute or define a magnetic tunnel junction MTJ. The second current I2 may be supplied to the magnetic domain D moved on the second lower magnetic pattern PL2, thereby reversing a magnetization direction of the moved magnetic domain D.

A second cell array structure CA2 may be provided on the substrate 100. The second cell array structure CA2 may have substantially the same components as the first cell array structure CA1. For example, the second cell array structure CA2 may include second group magnetic patterns GR2 including a third free magnetic pattern RC3 and a fourth free magnetic pattern RC4. The second cell array structure CA2 may include a second transistor region TD2 which includes second transistors TR2 connected to the second group magnetic patterns GR2. The second transistor region TD2 may include a $(2\_1)^{th}$ transistor region TD2_1 provided under the first end region ER1 and a $(2\_2)^{th}$ transistor region TD2_2 provided under the second end region ER2. The second cell array structure CA2 may include a second center transistor region TCR2 provided under the center region CR between the first end region ER1 and the second end region ER2. The second center transistor region TCR2 may include second center transistors TC2 arranged in the second direction D2.

At least one of the second group magnetic patterns GR2 may be disposed between the first group magnetic patterns GR1. For example, the third free magnetic pattern RC3 may be disposed between the first free magnetic pattern RC1 and the second free magnetic pattern RC2. The fourth free magnetic pattern RC4 may be spaced apart from the third free magnetic pattern RC3 with the second free magnetic pattern RC2 interposed therebetween. In other words, the first group magnetic patterns GR1 and the second group magnetic patterns GR2 may be alternately arranged in the second direction D2. A distance between the first free magnetic pattern RC1 and the third free magnetic pattern RC3 may be substantially equal to a distance between the third free magnetic pattern RC3 and the second free magnetic pattern RC2. For example, a pitch of the first to fourth free magnetic patterns RC1 to RC4 may be a half of a pitch of the first group magnetic patterns GR1.

Lengths of the second group magnetic patterns GR2 may be substantially equal to the lengths of the first group magnetic patterns GR1. In the first end region ER1, end portions of the second group magnetic patterns GR2 may be spaced apart from the end portions of the first group magnetic patterns GR1 in the first direction D1. Likewise, in the second end region ER2, end portions of the second group magnetic patterns GR2 may be spaced apart from the end portions of the first group magnetic patterns GR1 in the first direction D1.

Under each of the first and second end regions ER1 and ER2, the second transistor region TD2 may be spaced apart or offset from the first transistor region TD1 in the first direction D1. For example, the second transistors TR2 (more particularly, gate electrodes GE of the second transistors TR2) may be spaced apart from the first transistors TR1 (more particularly, the gate electrodes GE of the first transistors TR1) in the first direction D1. At least some of the gate electrodes GE of the second transistors TR2 may have respective sidewalls that are aligned with those of at least some of the gate electrodes GE of the first transistors TR1 in the first direction D1. First dopant regions SD1 of the second transistors TR2 may be aligned with the second dopant regions SD2 of the first transistors TR1 in the first direction D1. Second dopant regions SD2 of the second transistors TR2 may be aligned with the first dopant regions SD1 of the first transistors TR1 in the first direction D1. This arrangement of the gate electrodes GE and the first and second dopant regions SD1 and SD2 may also be applied to the first center transistor region TCR1 and the second center transistor region TCR2.

A distance between the $(1\_1)^{th}$ transistor region TD1_1 and the $(2\_1)^{th}$ transistor region TD2_1 may be substantially equal to a distance between the $(1\_2)^{th}$ transistor region TD1_2 and the $(2\_2)^{th}$ transistor region TD2_2. Likewise, the second center transistor region TCR2 may be spaced apart from the first center transistor region TCR1 in the first direction D1.

In free magnetic patterns including magnetic domains arranged in a track form, a driving current for moving the magnetic domain may be relatively great, and large-sized transistors (e.g., transistors having large gate widths) may be required to provide the great driving current. According to the embodiments of the inventive concepts, the free magnetic patterns of a plurality of the cell array structures may be alternately arranged, and the transistors connected thereto may be disposed to be spaced apart from each other in the longitudinally extending direction of the free magnetic patterns. Thus, the integration density of the magnetic memory device may be improved.

Figure 7:
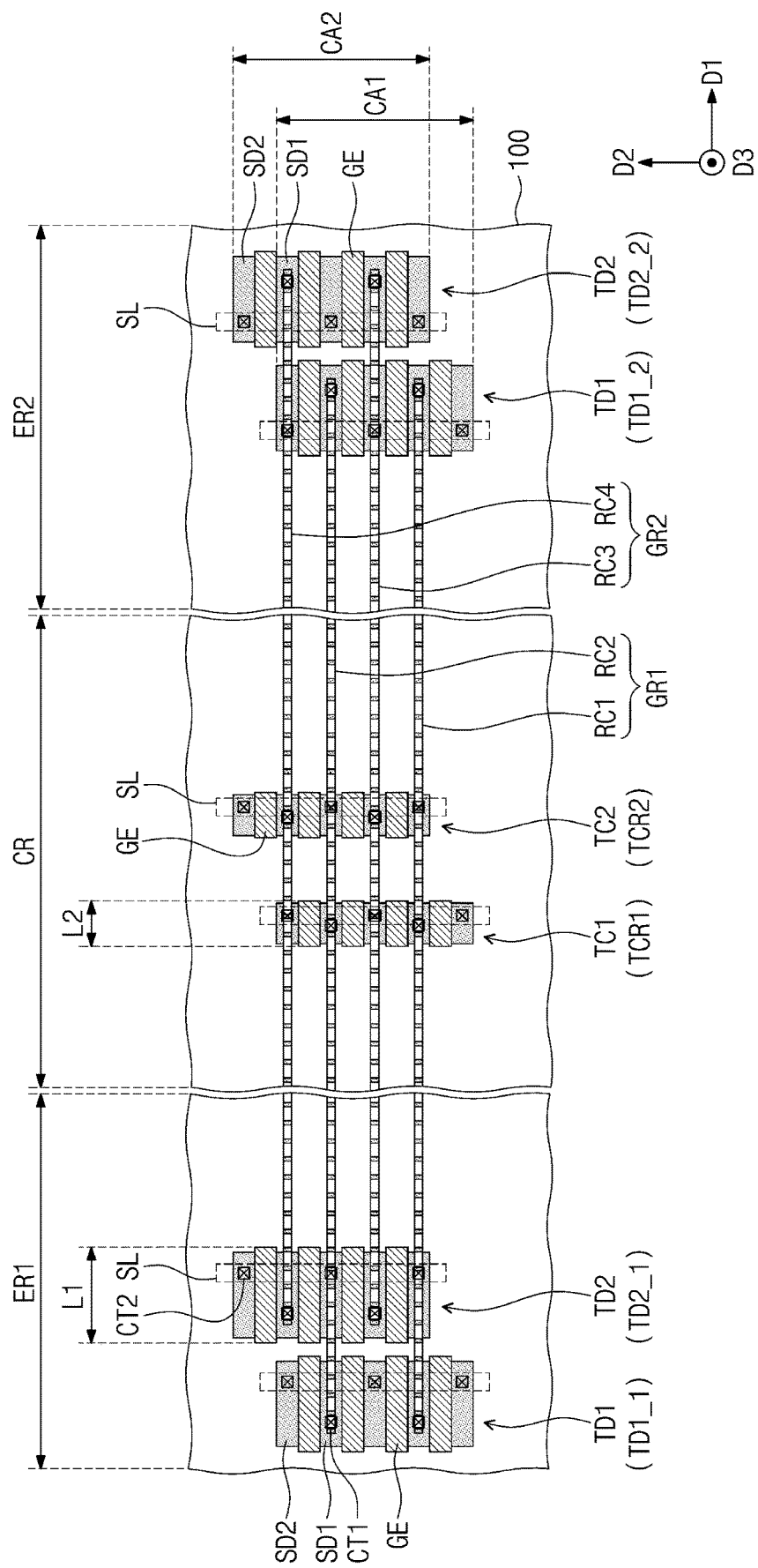
FIGS. 7 and 8 are plan views illustrating magnetic memory devices according to some embodiments of the inventive concepts.
Figure 8:
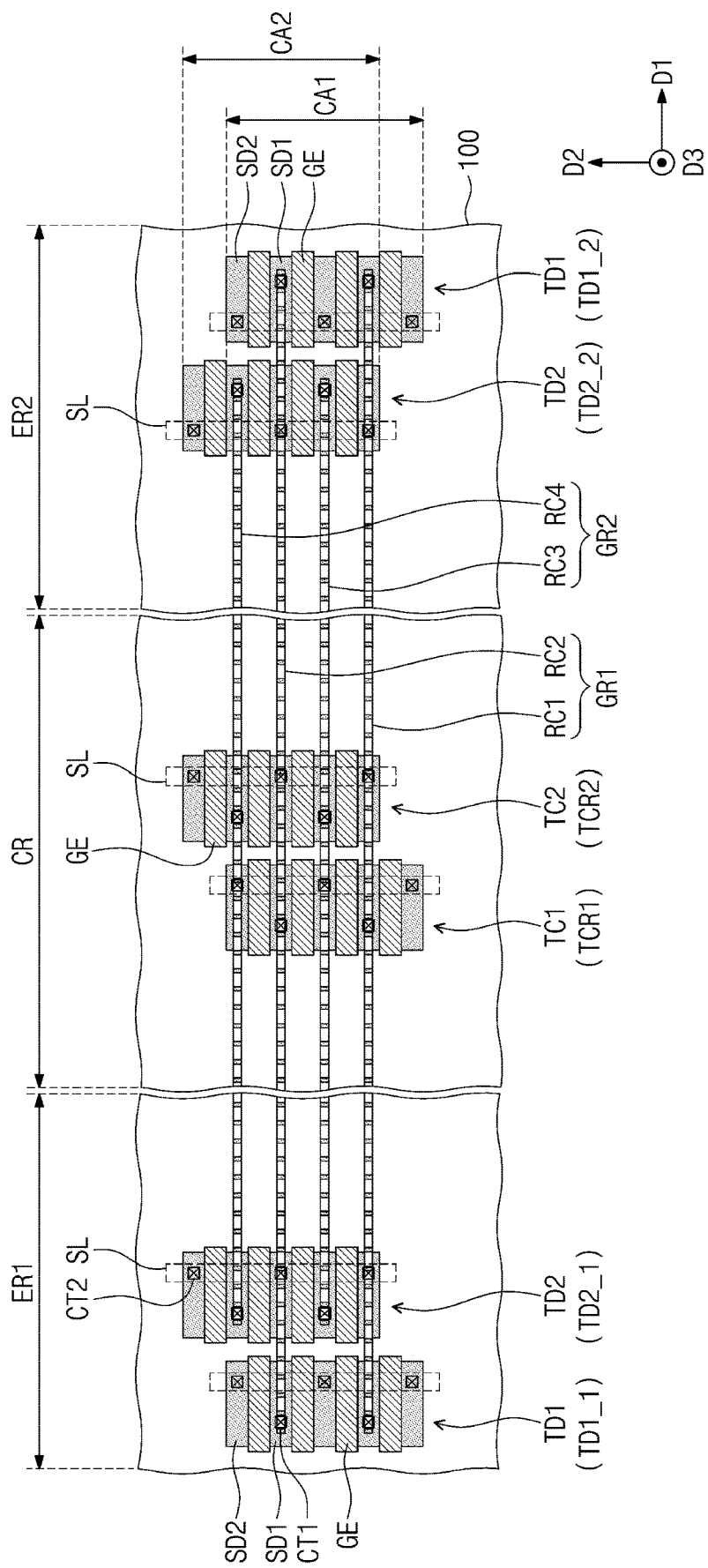

FIGS. 7 and 8 are plan views illustrating magnetic memory devices according to some embodiments of the inventive concepts. Hereinafter, the descriptions to the same or similar structures and features as in the above embodiments will be omitted for the purpose of ease and convenience in explanation.

Referring to FIG. 7, lengths L2, in the first direction D1, of gate electrodes GE of first and second center transistors TC1 and TC2 may be less than lengths L1, in the first direction D1, of gate electrodes GE of first and second transistors TR1 and TR2. For example, the lengths L2, in the first direction D1, of the gate electrodes GE of the first and second center transistors TC1 and TC2 may range from about 50% to about 80% of the lengths L1, in the first direction D1, of the gate electrodes GE of the first and second transistors TR1 and TR2.

Referring to FIG. 8, arrangement of the first and second contacts CT1 and CT2 and the source line SL of the $(2\_1)^{th}$ transistor region TD2_1 of the first end region ER1 and arrangement of the first and second contacts CT1 and CT2 and the source line SL of the $(2\_2)^{th}$ transistor region TD2_2 of the second end region ER2 may be mirror-symmetric with respect to the center region CR. Lengths of the second group magnetic patterns GR2 in the first direction D1 may be less than lengths of the first group magnetic patterns GR1 in the first direction D1. For example, lengths of the third and fourth free magnetic patterns RC3 and RC4 may be shorter than lengths of the first and second free magnetic patterns RC1 and RC2.

Figure 9:
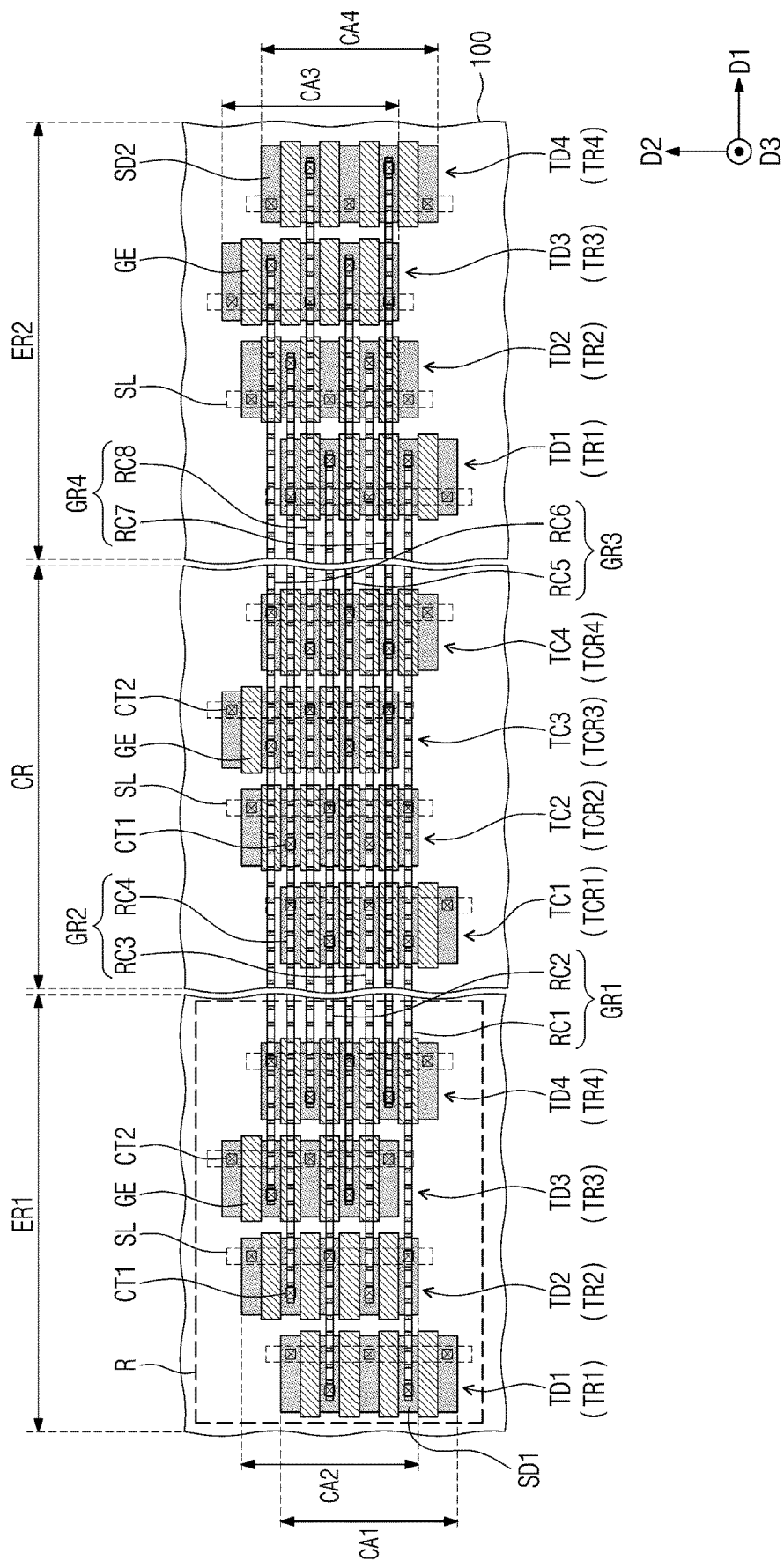
FIG. 9 is a plan view illustrating a magnetic memory device according to some embodiments of the inventive concepts.
Figure 10:
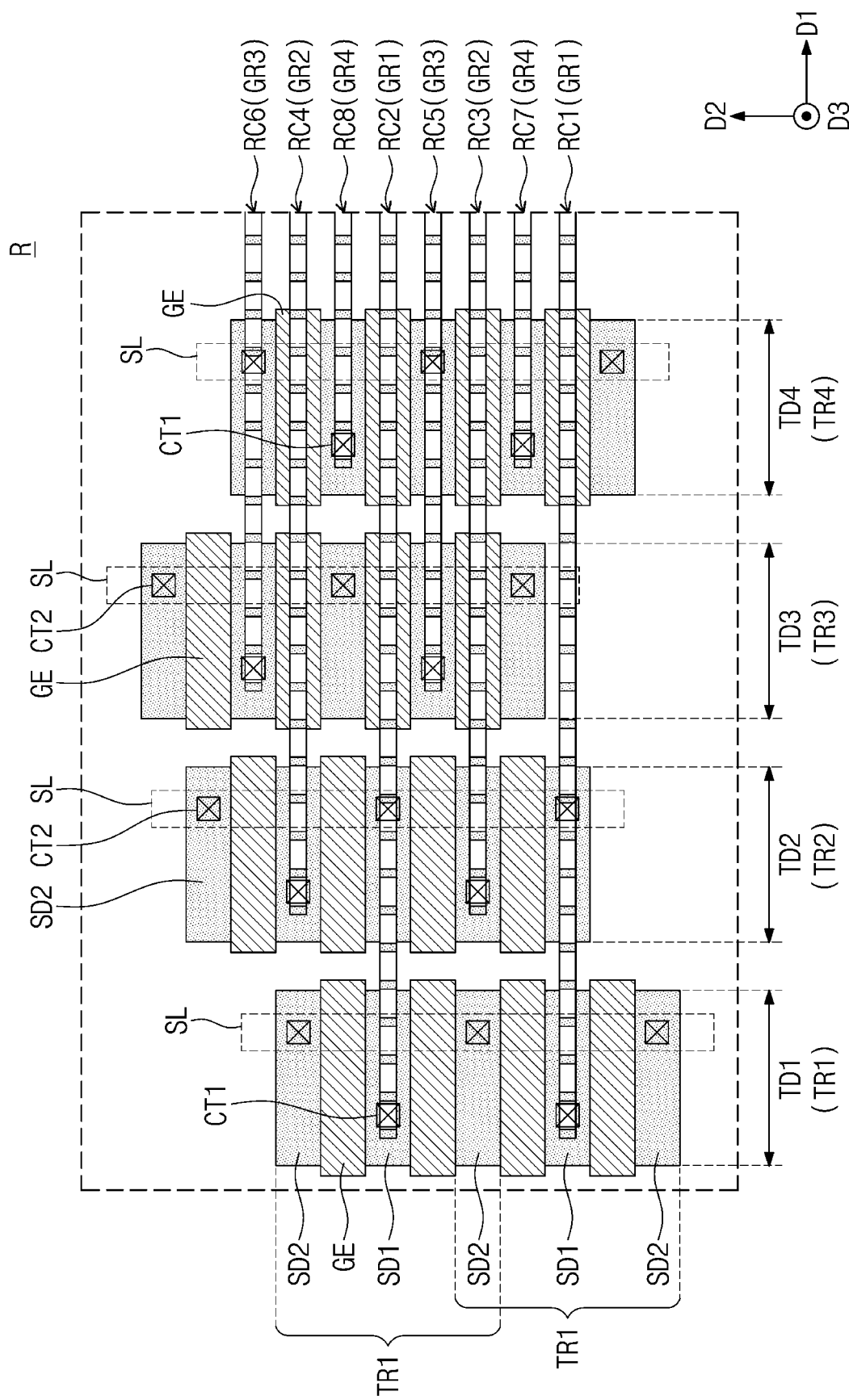
FIG. 10 is an enlarged view of a region 'R' of FIG. 9.

FIG. 9 is a plan view illustrating a magnetic memory device according to some embodiments of the inventive concepts. FIG. 10 is an enlarged view of a region 'R' of FIG. 9. Hereinafter, the descriptions to the same structures and features as in the above embodiments will be omitted for the purpose of ease and convenience in explanation.

Referring to FIGS. 9 and 10, first to fourth cell array structures CA1 to CA4 may be provided on a substrate 100. Components and arrangement of the first and second cell array structures CA1 and CA2 may be substantially the same as described with reference to FIG. 1. The third cell array structure CA3 may have substantially the same components as the first cell array structure CA1. For example, the third cell array structure CA3 may include third group magnetic patterns GR3 including a fifth free magnetic pattern RC5 and a sixth free magnetic pattern RC6. End portions of the third group magnetic patterns GR3 may be spaced apart from the end portions of the second group magnetic patterns GR2 in the first direction D1. The third cell array structure CA3 may include a third transistor region TD3 which includes third transistors TR3 connected to the third group magnetic patterns GR3.

The fifth free magnetic pattern RC5 may be disposed between the second free magnetic pattern RC2 and the third free magnetic pattern RC3. The sixth free magnetic pattern RC6 may be spaced apart from the second free magnetic pattern RC2 with the fourth free magnetic pattern RC4 interposed therebetween. The third transistor region TD3 may be spaced apart from the second transistor region TD2 in the first direction D1.

The fourth cell array structure CA4 may have substantially the same components as the first cell array structure CA1. For example, the fourth cell array structure CA4 may include fourth group magnetic patterns GR4 including a seventh free magnetic pattern RC7 and an eighth free magnetic pattern RC8. End portions of the fourth group magnetic patterns GR4 may be spaced apart from the end portions of the third group magnetic patterns GR3 in the first direction D1. The fourth cell array structure CA4 may include a fourth transistor region TD4 which includes fourth transistors TR4 connected to the fourth group magnetic patterns GR4.

The seventh free magnetic pattern RC7 may be disposed between the first free magnetic pattern RC1 and the third free magnetic pattern RC3. The eighth free magnetic pattern RC8 may be disposed between the second free magnetic pattern RC2 and the fourth free magnetic pattern RC4. The fourth transistor region TD4 may be spaced apart from the third transistor region TD3 in the first direction D1. For example, a pitch of the first to eighth free magnetic patterns RC1 to RC8 may be ¼ of the pitch of the first group magnetic patterns GR1.

Figure 11:
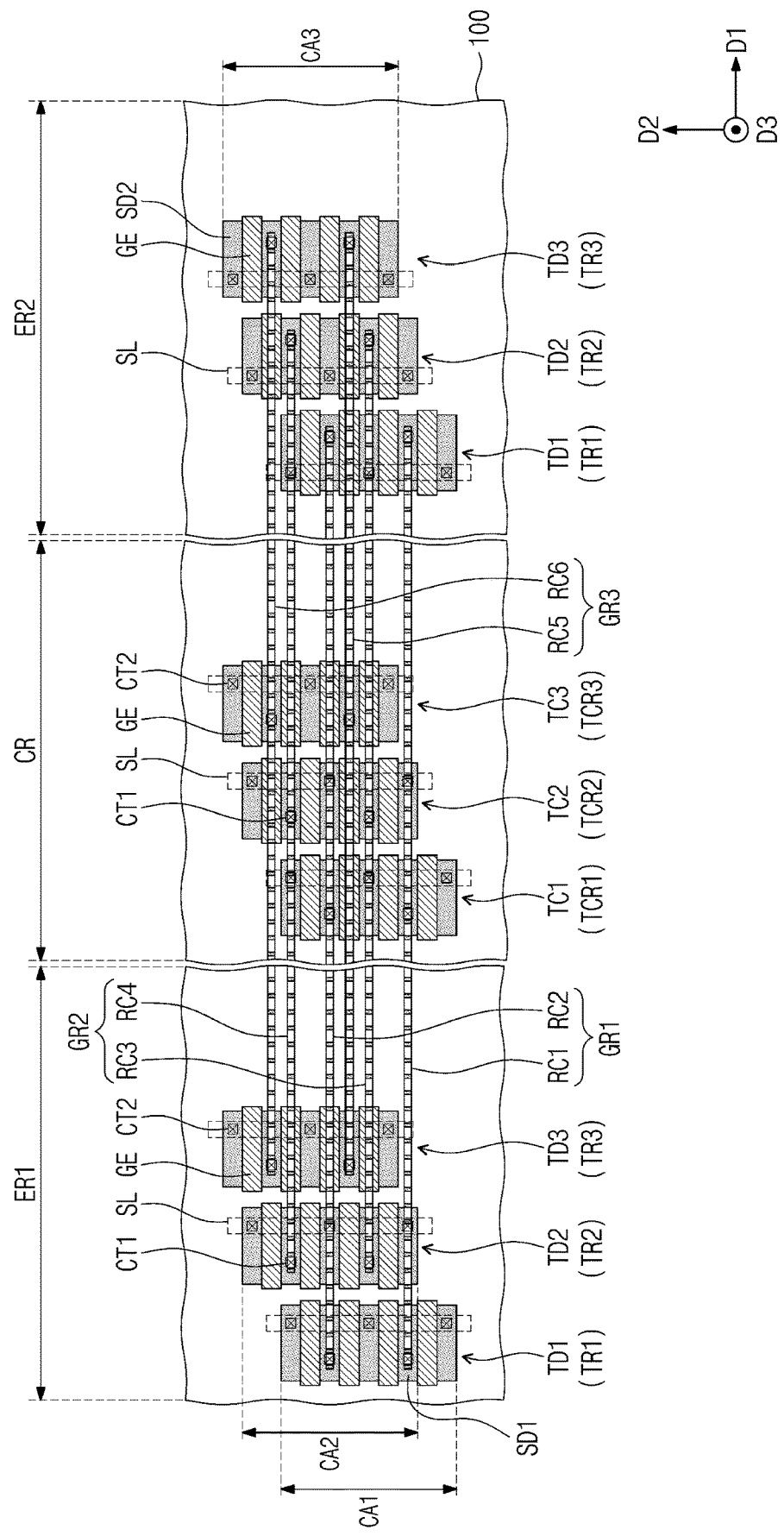
FIG. 11 is a plan view illustrating a magnetic memory device according to some embodiments of the inventive concepts.

FIG. 11 is a plan view illustrating a magnetic memory device according to some embodiments of the inventive concepts.

The present embodiment is an embodiment in which the fourth cell array structure CA4 is omitted from the embodiment of FIG. 9. A distance between the first free magnetic pattern RC1 and the second free magnetic pattern RC2 may be twice or more a distance between the second free magnetic pattern RC2 and the third free magnetic pattern RC3.

Figure 12:
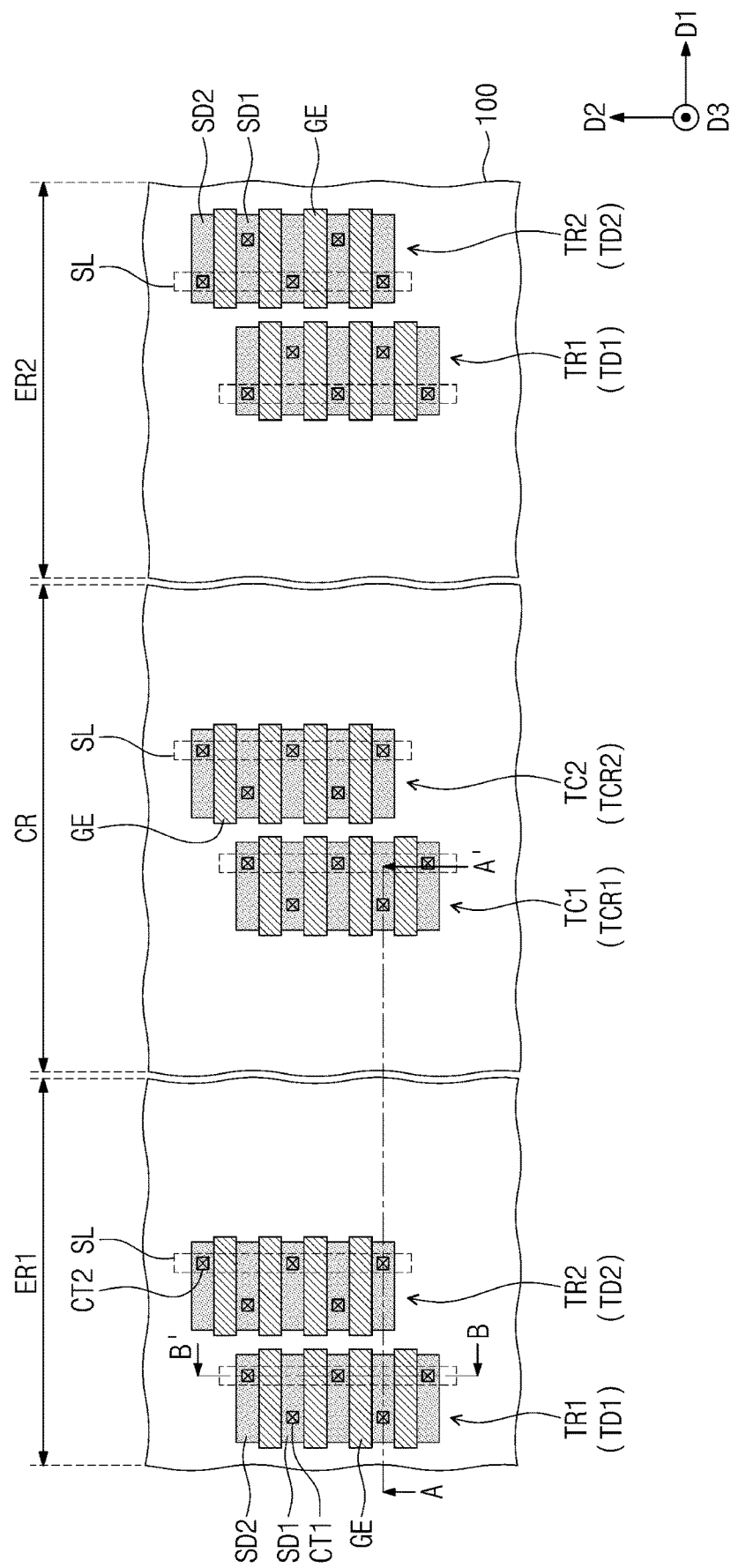
FIG. 12 is a plan view illustrating a method of manufacturing a magnetic memory device according to some embodiments of the inventive concepts.
Figure 13:
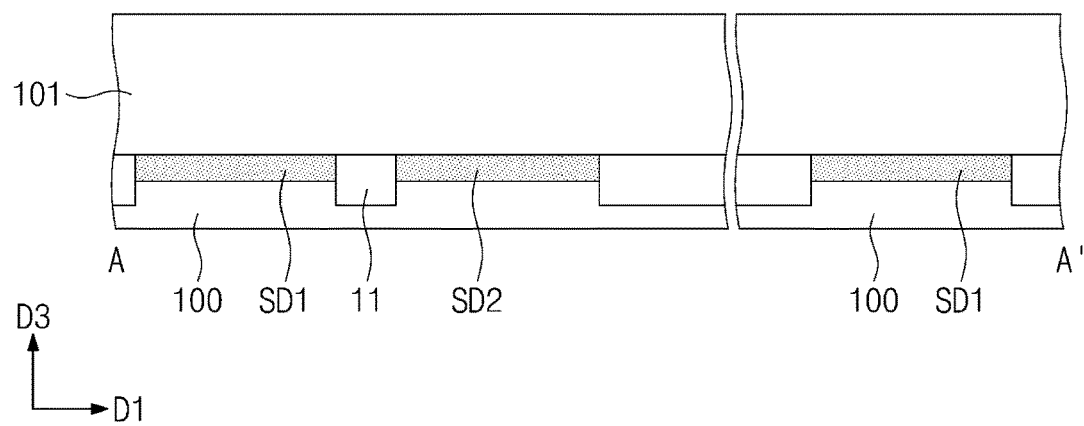
FIGS. 13 and 15 are cross-sectional views taken along a line A-A' of FIG. 12.
Figure 14:
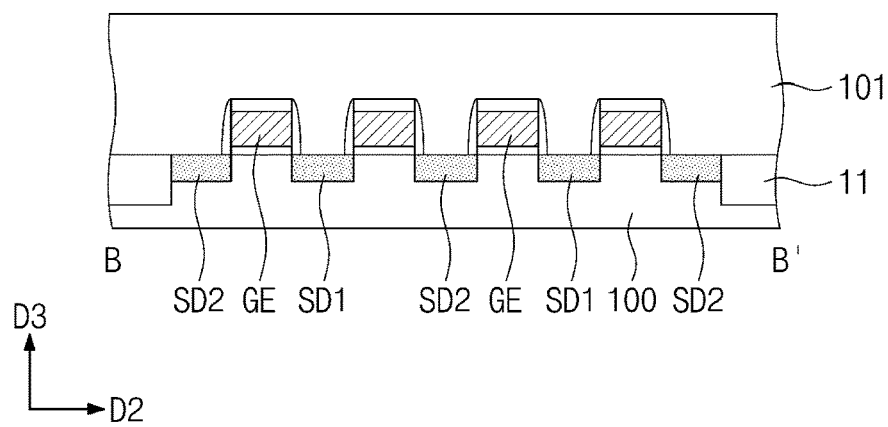
FIGS. 14 and 16 are cross-sectional views taken along a line B-B' of FIG. 12.
Figure 15:
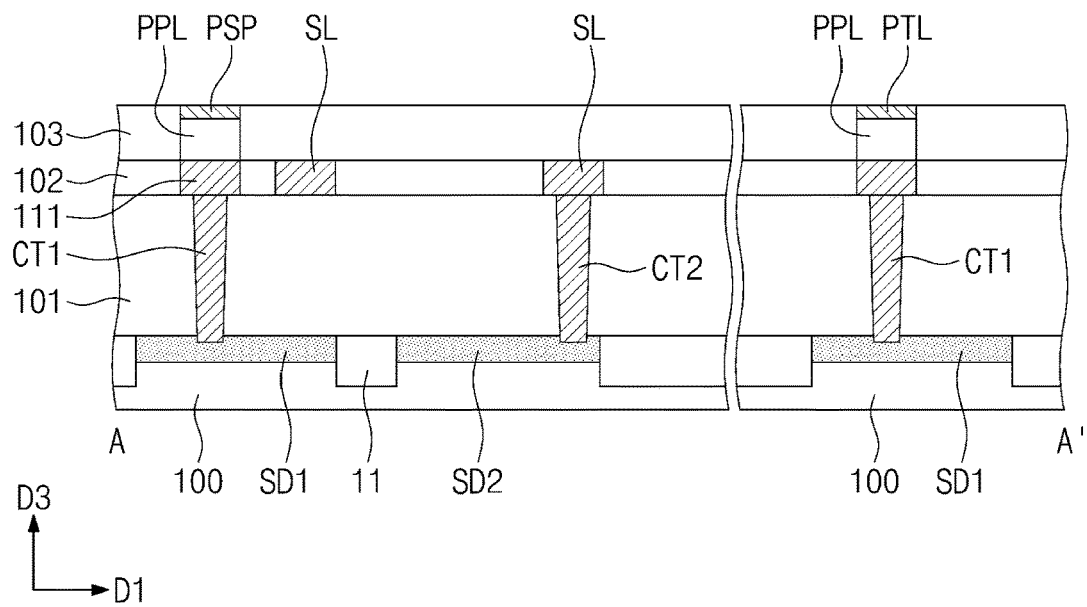
Figure 16:
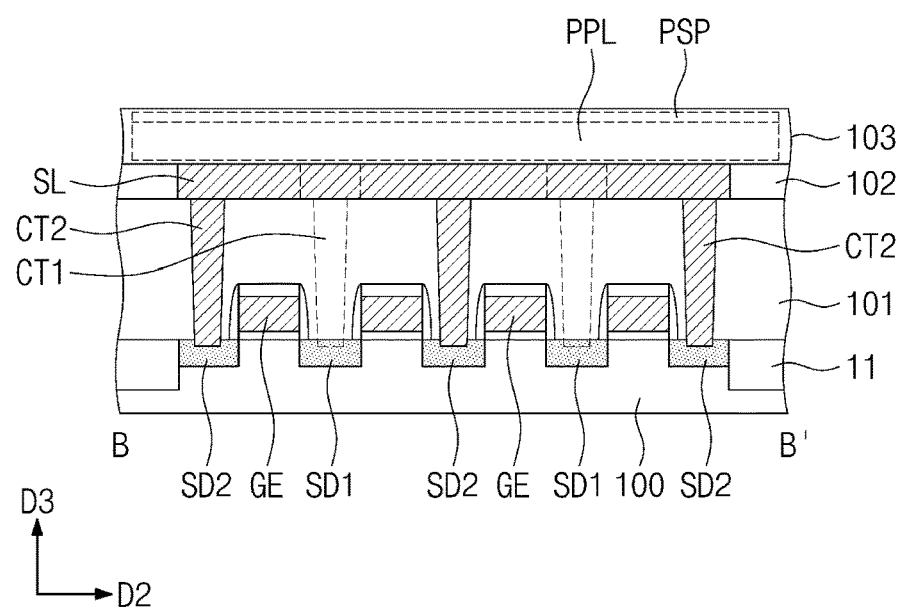
Figure 17:
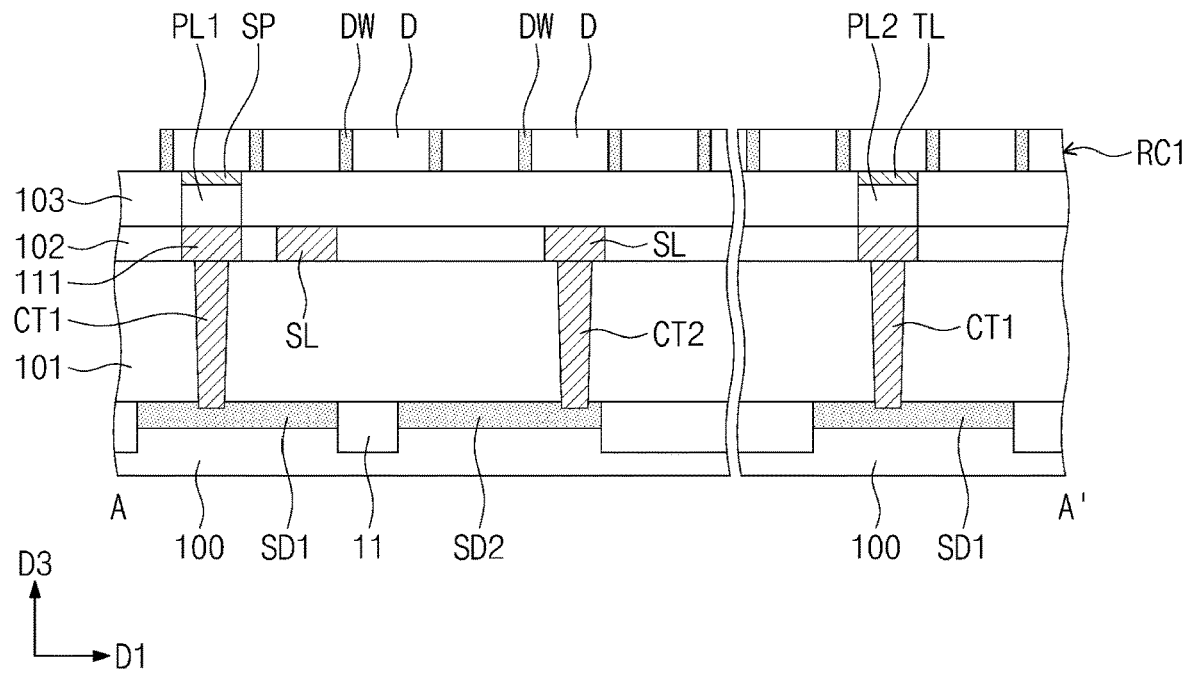
FIG. 17 is a cross-sectional view taken along the line A-A' of FIG. 1.
Figure 18:
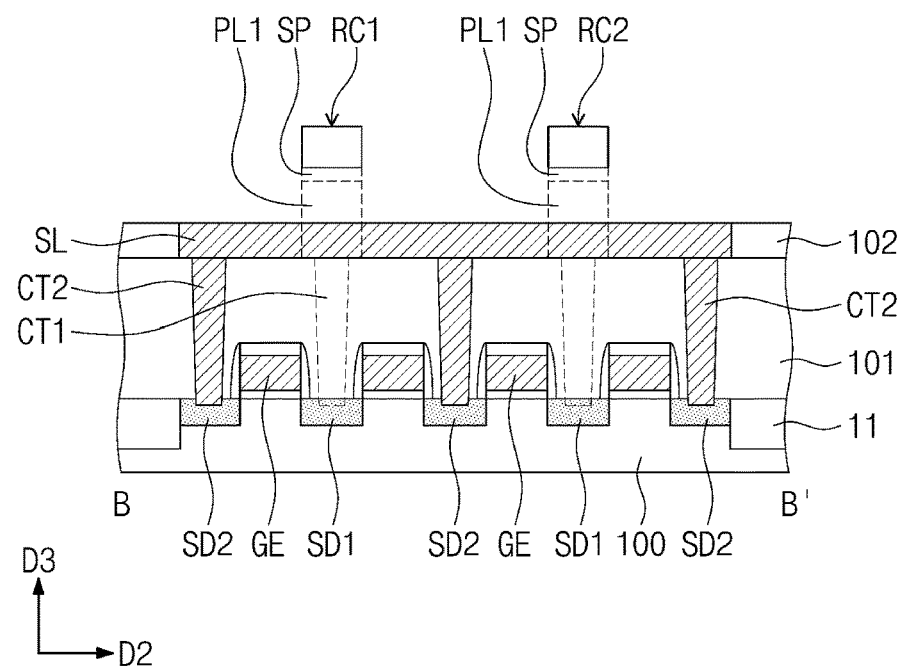
FIG. 18 is a cross-sectional view taken along the line B-B' of FIG. 1.

FIG. 12 is a plan view illustrating a method of manufacturing a magnetic memory device according to some embodiments of the inventive concepts. FIGS. 13 and 15 are cross-sectional views taken along a line A-A' of FIG. 12. FIGS. 14 and 16 are cross-sectional views taken along a line B-B' of FIG. 12. FIG. 17 is a cross-sectional view taken along the line A-A' of FIG. 1. FIG. 18 is a cross-sectional view taken along the line B-B' of FIG. 1.

Referring to FIGS. 12 to 14, first and second transistors TR1 and TR2 and first and second center transistors TC1 and TC2 may be formed on a substrate 100. A device isolation layer 11 and gate electrodes GE may be formed on the substrate 100. A trench may be formed in an upper portion of the substrate 100, and then, the device isolation layer 11 may be formed in the trench by filling the trench with an insulating layer such as a silicon oxide layer. A conductive layer (e.g., a metal and/or doped silicon) may be stacked on the substrate 100, and then, a patterning process may be performed on the conductive layer to form the gate electrodes GE. A gate insulating layer (or a tunnel insulating layer) may be formed before formation of the conductive layer. First and second dopant regions SD1 and SD2 may be formed. For example, the first and second dopant regions SD1 and SD2 may be formed by injecting N-type dopants into the substrate 100 after the formation of the gate electrodes GE.

The gate electrodes GE may be arranged in the second direction D2 in each of transistor regions TD1, TD2, TCR1 and TCR2. The first and second dopant regions SD1 and SD2 may be disposed in the substrate 100 between the gate electrodes GE. A first interlayer insulating layer 101 may be formed to extend on or cover the substrate 100. The first interlayer insulating layer 101 may be formed by a chemical vapor deposition (CVD) process. For example, the first interlayer insulating layer 101 may be formed of silicon oxide, silicon nitride, and/or silicon oxynitride.

Referring to FIGS. 12, 15 and 16, first contacts CT1 and second contacts CT2 may be formed to penetrate the first interlayer insulating layer 101. The first contacts CT1 may be connected to the first dopant regions SD1, and the second contacts CT2 may be connected to the second dopant regions SD2. The formation of the first and second contacts CT1 and CT2 may include forming contact holes which penetrate the first interlayer insulating layer 101 to expose the substrate 100, and filling the contact holes with a conductive material. For example, the first and second contacts CT1 and CT2 may be formed of a conductive material such as a metal material (e.g., tungsten, titanium, copper, or aluminum) and/or a conductive nitride thereof. For example, the first and second contacts CT1 and CT2 may be formed by a CVD method or a physical vapor deposition (PVD) method (e.g., a sputtering deposition method).

The first contacts CT1 may be aligned with each other in the second direction D2 in each of the transistor regions TD1, TD2, TCR1 and TCR2. The second contacts CT2 may also be aligned with each other in the second direction D2. The second contacts CT2 may be spaced apart from the first contacts CT1 in the first direction D1.

A second interlayer insulating layer 102 may be formed to extend on or cover the first and second contacts CT1 and CT2, and then, bottom electrodes 111 and source lines SL may be formed in the second interlayer insulating layer 102. The bottom electrodes 111 may be disposed on the first contacts CT1, respectively. Each of the source lines SL may be formed to be connected in common to the second contacts CT2 arranged in the second direction D2. In the present embodiment, the bottom electrodes 111 and the source lines SL may be formed together. Alternatively, the source lines SL may be formed at a different level or different distance from the substrate 100 than that of the bottom electrodes 111. The source lines SL and the bottom electrodes 111 may be formed of a metal material (e.g., tungsten, titanium, copper, or aluminum) and/or a conductive metal nitride thereof.

Preliminary magnetic patterns PPL may be formed on the bottom electrodes 111. The preliminary magnetic patterns PPL may extend in the second direction D2 and may be spaced apart from each other in the first direction D1. Preliminary conductive spacers PSP and preliminary tunnel barrier patterns PTL may be formed on the preliminary magnetic patterns PPL. The preliminary conductive spacers PSP may be formed on preliminary magnetic patterns PPL which will be patterned into first lower magnetic patterns, and the preliminary tunnel barrier patterns PTL may be formed on preliminary magnetic patterns PPL which will be patterned into second lower magnetic patterns. For example, the preliminary conductive spacers PSP and the preliminary tunnel barrier patterns PTL may be formed together with the preliminary magnetic patterns PPL by the same patterning process. Thus, the preliminary conductive spacers PSP and the preliminary tunnel barrier patterns PTL may extend in the second direction D2. The preliminary conductive spacers PSP may be formed of a conductive material such as a metal material (e.g., tungsten, titanium, copper, or aluminum) and/or a conductive nitride thereof. The preliminary tunnel barrier patterns PTL may be formed of at least one of a magnesium oxide (MgO) layer, a titanium oxide (TiO) layer, an aluminum oxide (AlO) layer, a magnesium-zinc oxide (MgZnO) layer, or a magnesium-boron oxide (MgBO) layer.

A third interlayer insulating layer 103 may be formed to extend on or cover the preliminary conductive spacers PSP and the preliminary tunnel barrier patterns PTL, and then, a planarization process may be performed on the third interlayer insulating layer 103 to expose top surfaces of the preliminary conductive spacers PSP and top surfaces of the preliminary tunnel barrier patterns PTL.

Referring to FIGS. 1, 17 and 18, a magnetic layer may be formed on the preliminary conductive spacers PSP and the preliminary tunnel barrier patterns PTL, and then, a patterning process may be performed on the magnetic layer to form first to fourth free magnetic patterns RC1 to RC4. By the patterning process, each of the preliminary conductive spacers PSP may be formed into conductive spacers SP spaced apart from each other in the second direction D2, and each of the preliminary tunnel barrier patterns PTL may be formed into tunnel barrier patterns TL spaced apart from each other in the second direction D2. In addition, each of the preliminary magnetic patterns PPL may be formed into lower magnetic patterns PL1 or PL2 spaced apart from each other in the second direction D2. Thereafter, a fourth interlayer insulating layer 104 may be formed to extend on or cover the first to fourth free magnetic patterns RC1 to RC4, as illustrated in FIGS. 3 and 4.

According to the embodiments of the inventive concepts, the free magnetic patterns of a plurality of the cell array structures may be alternately arranged, and the transistors connected thereto may be disposed to be spaced apart from each other in the extending direction of the free magnetic patterns. Thus, the integration density of the magnetic memory device may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scope of the inventive concepts being determined by the broadest permissible interpretation of the following claims and their equivalents, and shall not be restricted or limited by the foregoing description.

What is claimed is:

1. A magnetic memory device comprising:
    a first cell array structure comprising first and second free magnetic patterns that extend in a first direction on a surface of a substrate and are spaced apart from each other in a second direction intersecting the first direction; and
    a second cell array structure comprising a third free magnetic pattern between the first and second free magnetic patterns, and a fourth free magnetic pattern spaced apart from the third free magnetic pattern in the second direction with the second free magnetic pattern therebetween,
    wherein the first cell array structure further comprises a first transistor region comprising first transistors connected to the first and second free magnetic patterns,
    wherein the second cell array structure further comprises a second transistor region comprising second transistors connected to the third and fourth free magnetic patterns, and
    wherein the second transistor region is spaced apart from the first transistor region in the first direction.

2. The magnetic memory device of claim 1, wherein a distance between the first free magnetic pattern and the third free magnetic pattern is substantially equal to a distance between the third free magnetic pattern and the second free magnetic pattern.

3. The magnetic memory device of claim 1, wherein each of the first transistor region and the second transistor region comprises:
    a pair of gate electrodes spaced apart from each other in the second direction with one of the first, second, third, or fourth free magnetic patterns therebetween when viewed in a plan view;
    a first dopant region between the pair of gate electrodes; and
    second dopant regions spaced apart from the first dopant region in the second direction with the pair of gate electrodes therebetween.

4. The magnetic memory device of claim 3, further comprising:
    first contacts connecting respective ones of the first dopant regions to the first, second, third, and fourth free magnetic patterns;
    first and second source lines extending in the second direction over the pair of gate electrodes of the first and second transistor regions, respectively; and second contacts connecting the first and second source lines to the second dopant regions of the first and second transistor regions, respectively.

5. The magnetic memory device of claim 4, wherein the second contacts are spaced apart from the first contacts in the first direction.

6. The magnetic memory device of claim 5, wherein respective sidewalls of the pair of gate electrodes of the second transistor region are aligned with respective sidewalls of the pair of gate electrodes of the first transistor region in the first direction.

7. The magnetic memory device of claim 4, further comprising:
respective conductive spacers between the first contacts and the first, second, third, and fourth free magnetic patterns; and
respective first lower magnetic patterns between the respective conductive spacers and the first contacts.

8. The magnetic memory device of claim 3, wherein the first transistor region is under a first center region between opposing end regions of the first and second free magnetic patterns, and
wherein the second transistor region is under a second center region between opposing end regions of the third and fourth free magnetic patterns.

9. The magnetic memory device of claim 8, further comprising:
first contacts connecting respective ones of the first dopant regions to the first, second, third, and fourth free magnetic patterns;
respective tunnel barrier patterns between the first contacts and the first, second, third, and fourth free magnetic patterns; and
respective second lower magnetic patterns between the respective tunnel barrier patterns and the first contacts.

10. The magnetic memory device of claim 1, wherein the first transistors are arranged in the second direction, and wherein the second transistors are arranged in the second direction.

11. The magnetic memory device of claim 1, wherein the first transistor region includes a pair of first transistor regions under opposing end regions of the first and second free magnetic patterns, and
wherein the second transistor region includes a pair of second transistor regions under opposing end regions of the third and fourth free magnetic patterns.

12. The magnetic memory device of claim 1, further comprising:
a third cell array structure comprising a fifth free magnetic pattern between the second and third free magnetic patterns, and a sixth free magnetic pattern spaced apart from the second free magnetic pattern in the second direction with the fourth free magnetic pattern therebetween,
wherein the third cell array structure further comprises a third transistor region comprising third transistors connected to the fifth and sixth free magnetic patterns, and
wherein the third transistor region is spaced apart from the second transistor region in the first direction.

13. The magnetic memory device of claim 12, further comprising:
a fourth cell array structure comprising a seventh free magnetic pattern between the first and third free magnetic patterns, and an eighth free magnetic pattern between the second and fourth free magnetic patterns, in the second direction,
wherein the fourth cell array structure further comprises a fourth transistor region comprising fourth transistors connected to the seventh and eighth free magnetic patterns, and
wherein the fourth transistor region is spaced apart from the third transistor region in the first direction.

14. The magnetic memory device of claim 1, wherein respective end portions of the third and fourth free magnetic patterns are spaced apart from respective end portions of the first and second free magnetic patterns in the first direction by a distance greater than that between the second transistor region and the first transistor region.

15. The magnetic memory device of claim 1, wherein respective lengths of the first, second, third, and fourth free magnetic patterns are substantially equal to each other.

16. A magnetic memory device comprising:
a first cell array structure comprising first group magnetic patterns extending in a first direction on a surface of a substrate and spaced apart from each other in a second direction intersecting the first direction, and a first transistor region comprising first transistors connected to the first group magnetic patterns; and
a second cell array structure comprising second group magnetic patterns extending in the first direction between the first group magnetic patterns, and a second transistor region comprising second transistors connected to the second group magnetic patterns,
wherein the first transistors are arranged in the second direction, the second transistors are arranged in the second direction, and the second transistor region is spaced apart from the first transistor region in the first direction.

17. The magnetic memory device of claim 16, wherein respective end portions of the second group magnetic patterns are spaced apart from respective end portions of the first group magnetic patterns in the first direction by a distance greater than that between the second transistor region and the first transistor region.

18. The magnetic memory device of claim 16, wherein respective sidewalls of gate electrodes of the second transistors are aligned with respective sidewalls of gate electrodes of the first transistors in the first direction.

19. A magnetic memory device comprising:
first group magnetic patterns extending in a first direction on a surface of a substrate and spaced apart from each other in a second direction intersecting the first direction;
second group magnetic patterns between the first group magnetic patterns;
a first transistor region comprising first transistors connected to first end regions of the first group magnetic patterns and arranged in the second direction;
a second transistor region comprising second transistors connected to second end regions of the second group magnetic patterns and arranged in the second direction;
a first center transistor region comprising first center transistors connected to respective first center regions of the first group magnetic patterns; and
a second center transistor region comprising second center transistors connected to respective second center regions of the second group magnetic patterns,
wherein the second transistor region is spaced apart from the first transistor region in the first direction, and
wherein each of the first and second transistor regions and each of the first and second center transistor regions comprises a pair of gate electrodes extending in the first direction and a first dopant region between the pair of gate electrodes.

20. The magnetic memory device of claim 19, wherein the first group magnetic patterns comprise first and second free magnetic patterns, and the second group magnetic patterns comprise a third free magnetic pattern between the first and second free magnetic patterns, and a fourth free magnetic pattern spaced apart from the third free magnetic pattern in the second direction with the second free magnetic pattern therebetween.

* * * * *